US010374636B1

(12) United States Patent
Yang et al.

(10) Patent No.: US 10,374,636 B1
(45) Date of Patent: *Aug. 6, 2019

(54) CIRCUIT STRUCTURE AND METHOD FOR HIGH-SPEED FORWARD ERROR CORRECTION

(71) Applicant: ALTERA CORPORATION, San Jose, CA (US)

(72) Inventors: Haiyun Yang, San Jose, CA (US); Martin Langhammer, Salisbury (CA); Peng Li, Palo Alto, CA (US); Divya Vijayaraghavan, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 375 days.

This patent is subject to a terminal disclaimer.

(21) Appl. No.: 15/090,170

(22) Filed: Apr. 4, 2016

Related U.S. Application Data

(63) Continuation of application No. 13/871,227, filed on Apr. 26, 2013, now Pat. No. 9,331,714.

(51) Int. Cl.
*H04L 1/00* (2006.01)
*H03M 13/29* (2006.01)
*H03M 13/13* (2006.01)

(52) U.S. Cl.
CPC ..... *H03M 13/2906* (2013.01); *H03M 13/136* (2013.01); *H04L 1/004* (2013.01); *H04L 2001/0094* (2013.01)

(58) Field of Classification Search
CPC ... H04L 1/0045; H04L 1/0057; H04L 1/0061; H04L 1/0071; H04L 1/004; H04L 2001/0094; G11B 20/18; H03M 13/2906; H03M 13/136

USPC .......................................................... 714/746
See application file for complete search history.

(56) References Cited

U.S. PATENT DOCUMENTS

| 6,628,725 B1 * | 9/2003 | Adam ..................... H04L 1/004 341/60 |
| 6,683,855 B1 | 1/2004 | Bordogna et al. |
| 7,065,696 B1 | 6/2006 | Liu et al. |
| 7,124,064 B1 * | 10/2006 | Thurston ............. G06F 17/5045 703/2 |
| 7,137,060 B2 | 11/2006 | Yu et al. |

(Continued)

OTHER PUBLICATIONS

100GE and 40GE PCS and MLD Proposal, Jan. 2008, 24 pages, IEEE 802.3ba, Portland.

(Continued)

*Primary Examiner* — Samir W Rizk
*Assistant Examiner* — Enam Ahmed
(74) *Attorney, Agent, or Firm* — Compass IP Law PC

(57) ABSTRACT

One embodiment relates a method of receiving data from a multi-lane data link. The data is encoded with an FEC code having a block length. The data is FEC encoded at a bus width which is specified within particular constraints. One constraint is that the FEC encoder bus width in bits is an exact multiple of a number of bits per symbol in the data. Another constraint may be that the FEC code block length is an exact multiple of the FEC encoder bus width. Another constraint may be that the FEC encoder bus width is an exact multiple of a number of serial lanes of the multi-lane interface. Other embodiments and features are also disclosed.

17 Claims, 8 Drawing Sheets

(56) References Cited

U.S. PATENT DOCUMENTS

| | | | |
|---|---|---|---|
| 8,514,634 B1* | 8/2013 | Wu | G11C 11/419 |
| | | | 365/156 |
| 8,732,375 B1 | 5/2014 | Vijayaraghavan et al. | |
| 2006/0101317 A1* | 5/2006 | Uemura | G06F 11/2215 |
| | | | 714/746 |
| 2009/0022492 A1* | 1/2009 | Brownlee | H04L 27/2096 |
| | | | 398/43 |
| 2010/0229067 A1* | 9/2010 | Ganga | H03M 5/145 |
| | | | 714/752 |
| 2010/0229071 A1* | 9/2010 | Ganga | H03M 13/05 |
| | | | 714/776 |
| 2012/0179949 A1* | 7/2012 | Wang | H04L 1/0041 |
| | | | 714/752 |
| 2013/0117639 A1* | 5/2013 | Ganga | H03M 5/145 |
| | | | 714/776 |
| 2014/0064352 A1* | 3/2014 | Zhong | H04L 25/03038 |
| | | | 375/233 |
| 2014/0269778 A1* | 9/2014 | Yang | H04J 3/0697 |
| | | | 370/503 |
| 2018/0041332 A1* | 2/2018 | Yang | H04J 3/0658 |

OTHER PUBLICATIONS 100G backplane PAM4 PHY encoding, Jan. 2012, 31 pages, IEEE P802.3bj, Newport Beach.

* cited by examiner

| Data Rate [Mbps] | 106250.0 | | | | | | | | | | |
|---|---|---|---|---|---|---|---|---|---|---|---|
| | | Level 1 | | | Level 2 | | | Level 3 | | | |
| RS Bus Width (sym) | | 16 | 32 | 68 | 17 | 18 | 20 | 30 | 36 | 44 | |
| clock rate [MHz] | | 664.1 | 332.0 | 156.3 | 625.0 | 590.3 | 531.3 | 354.2 | 295.1 | 241.5 | |
| PMA output | width (bits) | | | | | 128 | | | | | |
| | rate [MHz] | | | | | 2072.5 | | | | | |
| Gearbox (per lane) | Output width (bits) | 40 | 80 | 170 | 42.5 | 45 | 50 | 75 | 90 | 110 | |
| | Input width (bits) | | | | | 10 | 10 | 10 | 10 | 40 | |
| | input rate [MHz] | 664.1 | 332.0 | 156.3 | 625.0 | 590.3 | 531.3 | 354.2 | 295.1 | 241.5 | |
| RS Encoder output | width [bits] | 160 | 320 | 680 | 170 | 180 | 200 | 300 | 360 | 440 | |
| | rate [MHz] | 664.1 | 332.0 | 156.3 | 625.0 | 590.3 | 531.3 | 354.2 | 295.1 | 241.5 | |
| TC Encoder output | width [bits] | | | | | 514 | | | | | |
| | rate [MHz] | 206.7 | 206.7 | 206.7 | 206.7 | 206.7 | 206.7 | 206.7 | 206.7 | 206.7 | |
| TC Encoder input | width [bits] | | | | | 512 | | | | | |
| | rate [MHz] | 206.7 | 206.7 | 206.7 | 206.7 | 206.7 | 206.7 | 206.7 | 206.7 | 206.7 | |

FIG. 7

CIRCUIT STRUCTURE AND METHOD FOR HIGH-SPEED FORWARD ERROR CORRECTION

CROSS-REFERENCE TO RELATED APPLICATION(S)

The present application is a continuation of U.S. patent application Ser. No. 13/871,227, filed Apr. 26, 2013, the disclosure of which is hereby incorporated by reference in its entirety.

TECHNICAL FIELD

The present invention relates generally to a circuit structure and method for high-speed forward error correction.

DESCRIPTION OF THE BACKGROUND ART

Forward error correction (FEC) may be used to provide data integrity for high-speed data communications. Reed-Solomon (RS) codes are one type of FEC. A circuit structure and method for high-speed FEC is desirable to meet the increasing performance requirements of high-speed networks.

SUMMARY

One embodiment relates a method of transmitting data from a multi-lane data link. The data is encoded with an FEC code having a block length. The data is FEC encoded at a bus width which is specified within particular constraints. One constraint is that the FEC encoder bus width in bits is an exact multiple of a number of bits per symbol in the data. Another constraint may be that the FEC block length is an exact multiple of the FEC encoder bus width. Another constraint may be that the FEC encoder bus width is an exact multiple of a number of serial lanes of the multi-lane interface.

Another embodiment relates to a method of transmitting data for a multi-lane data link. The data is encoded with an FEC code having a block length. The data may be FEC encoded at a third bus width which is specified within particular constraints. One constraint is that the third bus width in bits is an exact multiple of a number of bits per symbol in the data. Another constraint may be that the FEC code block length is an exact multiple of the third bus width. Another constraint may be that the third bus width in bits is an exact multiple of a number of serial lanes of the multi-lane interface. The data may then be received by gearbox circuits at a second bus width per lane and converted by the gearbox circuits to a first bus width per lane. The data may then be serialized.

Another embodiment relates to a transmitter for a multi-lane data link. The transmitter includes at least a plurality of physical media attachment circuits, a plurality of gearbox circuits, and an FEC encoder. Each physical media attachment circuit receives data at a first bus width and serializes the data for one lane. Each gearbox circuit converts the data from a second bus width to the first bus width. The FEC encoder encodes the data at a third bus width which is specified within particular constraints. One constraint is that the third bus width in bits is an exact multiple of a number of bits per symbol in the data. Another constraint may be that the FEC code block length is an exact multiple of the third bus width. Another constraint may be that the third bus width in bits is an exact multiple of a number of serial lanes of the multi-lane interface.

Other embodiments, aspects and features are also disclosed herein.

BRIEF DESCRIPTION OF THE DRAWINGS

FIG. 7 provides a table showing various features of select embodiments of the invention.

DETAILED DESCRIPTION

As disclosed herein, the efficiency of decoding of FEC code by a multi-lane receiver depends substantially on the specific bus width used. The parallelism may be achieved by selecting the bus width of the FEC decoder to satisfy particular conditions.

Three particular conditions are disclosed herein, and the parallel architecture of an FEC decoder may satisfy all three conditions or certain subsets of the three conditions. A first condition is that the bus width of the FEC decoder is an exact multiple of a number of bits per symbol in the data. A second condition is that the block length in bits is an exact multiple of the bus width of the FEC decoder. A third condition is that the bus width of the FEC decoder is an exact multiple of the number of physical serial lanes of the multi-lane interface Three levels of parallel architecture for an FEC decoder in a multi-lane receiver are disclosed herein. A first level (Level 1) has a bus width that satisfies all three of the above conditions. A second level (Level 2) has a bus width that satisfies the first and second conditions, but not the third condition. A third level (Level 3) has a bus width that satisfies the first and third conditions, but not the second condition.

A receiver implementing the FEC decoder with the above-discussed second level of parallel architecture may require use of an "elastic" gearbox. As disclosed herein, an elastic gearbox in a receiver may switch its output between multiple bus widths to effectively achieve a fractional (i.e. a non-whole-number) bus width. For example, there may be four elastic gearboxes for a 4-lane receiver. A first pair of the elastic gearbox circuits outputs 42 bits on even clock cycles and 43 bits on odd clock cycles, and a second pair of the elastic gearbox circuits outputs 42 bits on odd clock cycles and 43 bits on even clock cycles. Hence, a total of 170 bits is output at each clock cycle. An elastic gearbox in a transmitter may similarly switch the bus width of its input.

A receiver implementing the FEC decoder with the above-discussed third level of parallel architecture may require use of a "variable" gearbox. As disclosed herein, a variable gearbox in a receiver may output different numbers of symbols for different clock cycles. For example, in a block of 13 cycles, a variable gearbox may output 11 symbols (i.e. have a bus width of 11 symbols in bits) for the first through twelfth cycles and may output 4 symbols (i.e. have a bus width of 4 symbols in bits) for the thirteenth cycle. In this example, over the thirteen cycles, 12×11+1×4=136 symbols would be output by the variable gearbox. If there are four variable gearboxes for a 4-lane receiver, then the four variable gearboxes would output 136×4=544 symbols over the thirteen cycles. A variable gearbox in a transmitter may similarly switch the bus width of its input.

Example Level 1 Embodiment

Figure 1:
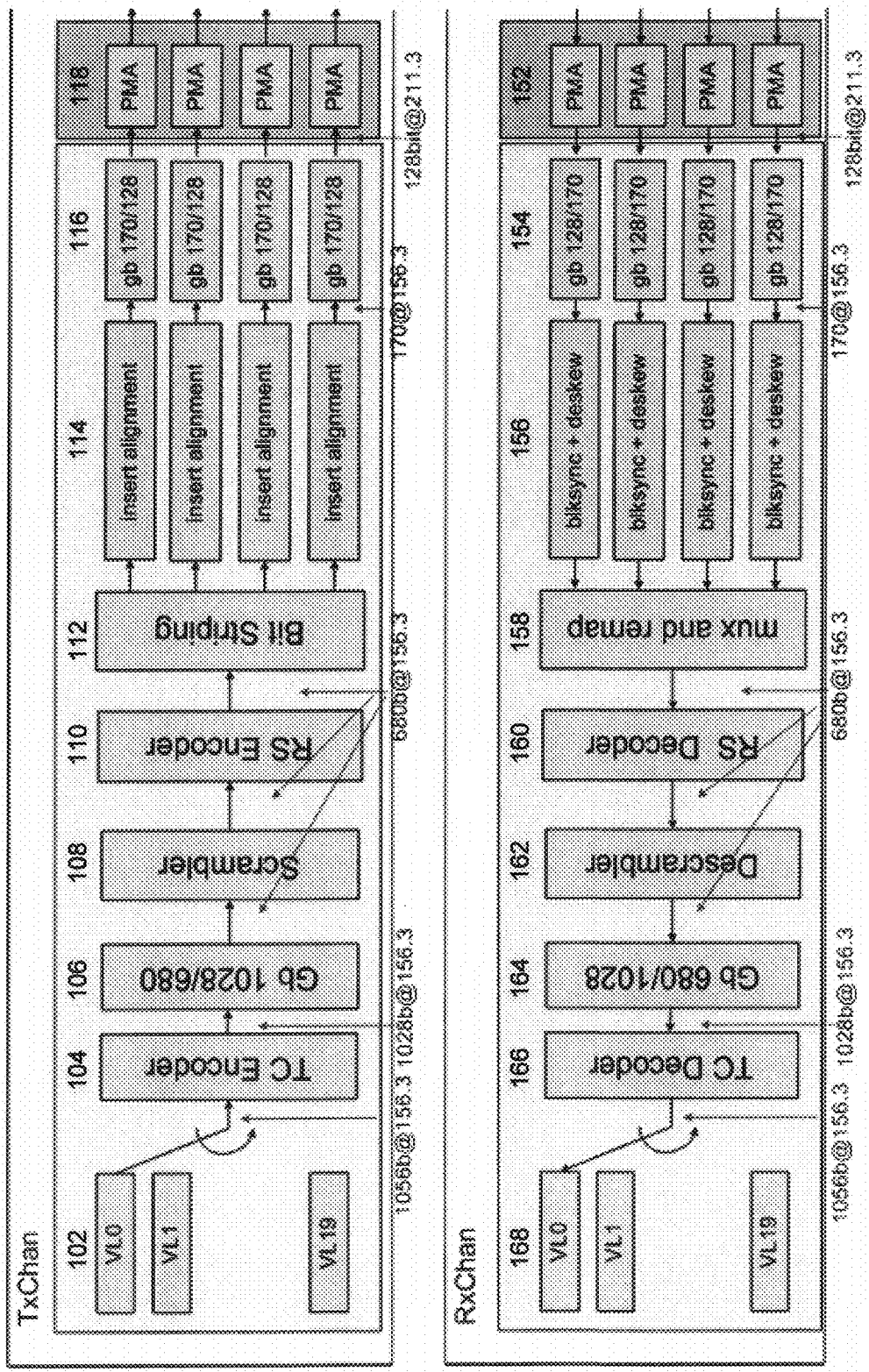
FIG. 1 depicts a transmitter and a receiver with high-speed forward error correction in accordance with a first embodiment of the present invention.
Figure 4:
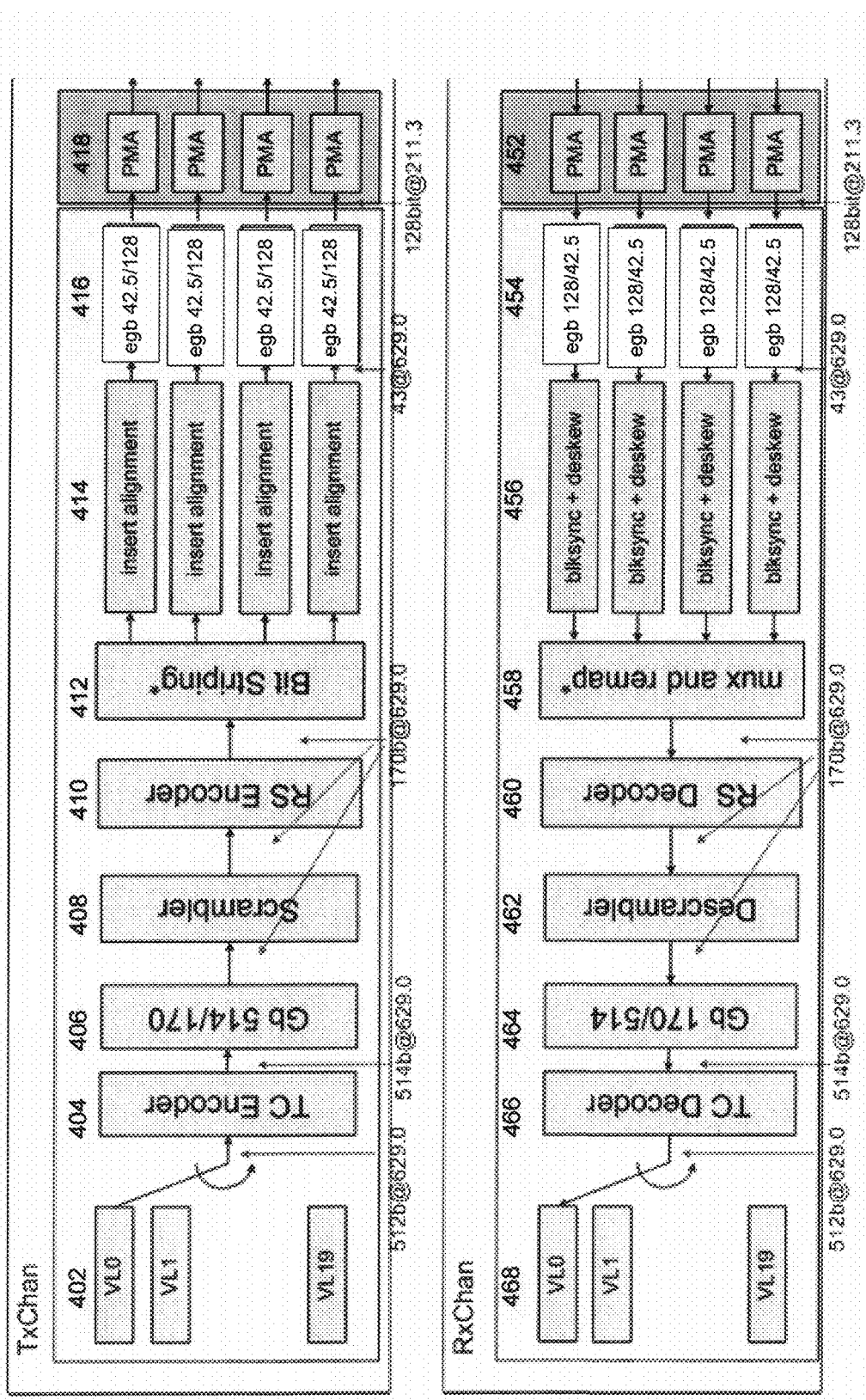
FIG. 4 depicts a transmitter and a receiver with high-speed forward error correction in accordance with a second embodiment of the present invention.
Figure 5:
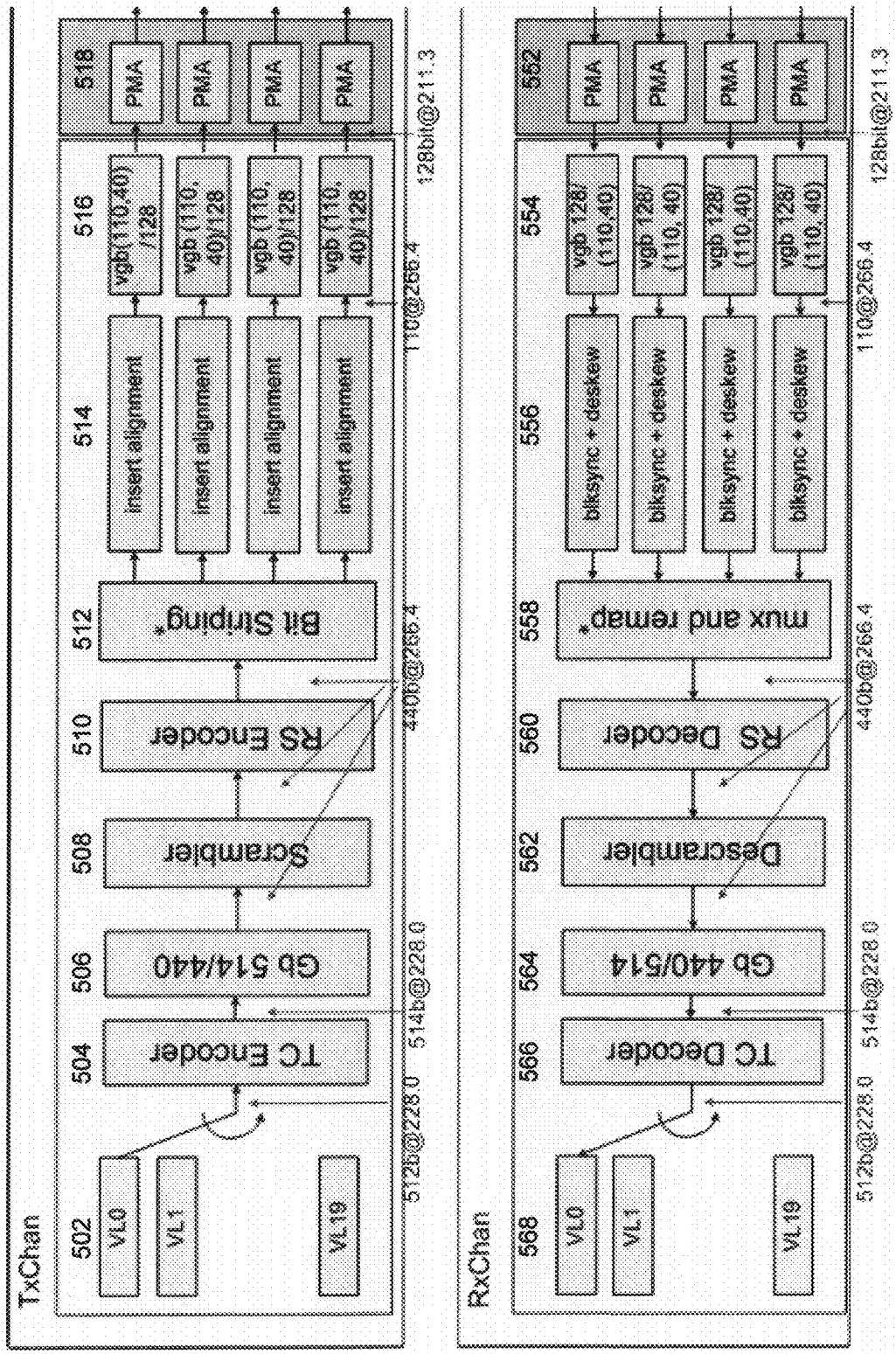
FIG. 5 depicts a transmitter and a receiver with high-speed forward error correction in accordance with a third embodiment of the present invention.

FIG. 1 depicts a transmitter (TxChan) and a receiver (RxChan) with high-speed forward error correction in accordance with a first embodiment of the present invention. The particular embodiment depicted in FIG. 1 satisfies the Level 1 conditions described above. In other words, the first, second and third conditions are all satisfied. The first condition is that the bus width of the RS decoder is an exact multiple of a number of bits per symbol in the data. The second condition is that the block length of the RS code in bits is an exact multiple of the bus width of the RS decoder. The third condition is that the bus width of the RS decoder is an exact multiple of the number of physical serial lanes of the multi-lane interface Note that the bus widths and operating frequencies indicated in FIG. 1 are from an exemplary embodiment. Similarly, the bus widths and operating frequencies indicated in FIGS. 4 and 5 are from exemplary embodiments. These bus widths and operating frequencies will change, in a manner disclosed herein, depending on the particular embodiment.

Transmitter (Level 1 Example)

The transmitter transmits data from multiple virtual lane queues 102. In the example depicted, there are twenty virtual lanes denoted VL0 through VL19. Other numbers of virtual lanes may be used in other embodiments.

The data may be input in a striped order from the virtual lanes to a transcoding encoder (TC encoder) 104. In the example depicted, the TC encoder 104 has an input bus width of 1056 bits and an output bus width of 1028 bits and operates at 156.3 megahertz (MHz).

An initial gearbox 106 may then be used to change the bus width. In the example depicted, the bus width is changed from 1028 bits to 680 bits while the frequency remains at 156.3 MHz.

The data may then be processed by a scrambler 108 and a Reed Solomon (RS) encoder 110. The scrambler 108 may be used to scramble the data. The RS encoder 110 encodes the data for forward error correction according to an RS code. The RS encoder 110 is an FEC encoder, and the RS code is a type of FEC code. In the example depicted, the scrambler 108 and the RS encoder 110 may each have input and output bus widths of 680 bits and may operate at 156.3 MHz.

A bit striping circuit 112 may then be used to stripe the data onto a plurality of physical lanes. In the example depicted, there are four physical lanes, and the bit striping circuit 112 may have an output bus width of 170 bits per lane while operating at 156.3 MHz. Other numbers of physical lanes are anticipated in other embodiments.

Each physical lane may have an alignment insertion circuit 114. Each alignment insertion circuit 114 may insert alignment blocks into the data being transmitted via its lane. The alignment blocks may be used by the receiver to synchronize the physical lanes for the purpose of deskewing the data transmitted on the lanes.

The bus width per lane and the frequency may then be changed using a set of gearboxes 116. In the example depicted, the bus width per lane is changed from 170 bits to 128 bits while the frequency changes from 156.3 MHz to 211.3 MHz. In the example depicted, four lanes of 128 bits at a frequency of 211.3 MHz provides a data rate of approximately 100 gigabits per second (100 Gbps).

Finally, each of the multiple physical lanes of data may then be serialized for transmission using physical media attachment (PMA) circuit 118. In the example depicted, each PMA circuit 118 has an input bus width of 128 bits and may output a high-speed serial bitstream. The serial output from the each PMA circuit 118 may be coded into multiple-level pulse amplitude modulation (PAM) symbols prior to transmission. In one example, 4-level PAM symbols (i.e. PAM-4) may be used.

Receiver (Level 1 Example)

Each of the PMA circuits 152 of the receiver receives serial data over the multiple physical lanes. The serial data is de-serialized by each PMA circuit 152. In the depicted example, the output of each PMA circuit 152 has a bus width per lane is 128 bits at 211.3 MHz. In the example depicted, four lanes of 128 bits at a frequency of 211.3 MHz provides a data rate of approximately 100 Gbps.

The bus width per lane and the frequency may then be changed using a set of gearboxes 154. In the example depicted, the bus width per lane is changed by each gearbox 154 from 128 bits to 170 bits while the frequency changes from 211.3 MHz to 156.3 MHz.

Each physical lane may have a block synchronization and deskew circuit 156. Each block synchronization and deskew circuit 156 may detect alignment blocks into the data received on its lane and use the alignment to deskew the data received relative to the other lanes. The output of the block synchronization and deskew circuit 156 maintains the bus width of 170 bits per lane and the frequency at 156.3 MHz.

Multiplexing and re-mapping (mux and remap) circuit 158 multiplexes the synchronized data from the four lanes and performs re-mapping of the data. In the example depicted, the output of the mux and remap circuit 158 has a bus width of 680 bits and a frequency of 156.3 MHz.

The RS decoder circuit 160 performs RS decoding on the data according to the RS code. The RS decoder 160 is an FEC decoder, and the RS code is a type of FEC code. In the example depicted, the RS decoder 160 may have input and output bus widths of 680 bits and may operate at 156.3 MHz.

Note that applicants have determined that the efficiency of decoding of RS code by a multi-lane receiver depends substantially on the specific bus width used by the RS decoder circuit 160. Hence, in accordance with an embodiment of the invention, the transmitter and the receiver are specifically structured to achieve such bus widths to enable efficient decoding.

A descrambler 162 may be used to descramble the data. In the example depicted, the descrambler 162 may have input and output bus widths of 680 bits and may operate at 156.3 MHz.

A last gearbox 166 may then be used to change the bus width. In the example depicted, the bus width is changed from 680 bits to 1028 bits while the frequency remains at 156.3 MHz.

A transcoding decoder (TC decoder) 166 receives and decodes the data. In the example depicted, the TC decoder 166 has an input bus width of 1028 bits and an output bus width of 1056 bits and operates at 156.3 megahertz (MHz).

The data output from the TC decoder 166 may be distributed (de-striped) to the multiple virtual lane buffers 168. In the example depicted, there are twenty virtual lanes denoted VL0 through VL19. Other numbers of virtual lanes may be used in other embodiments.

Figures 2, 3:
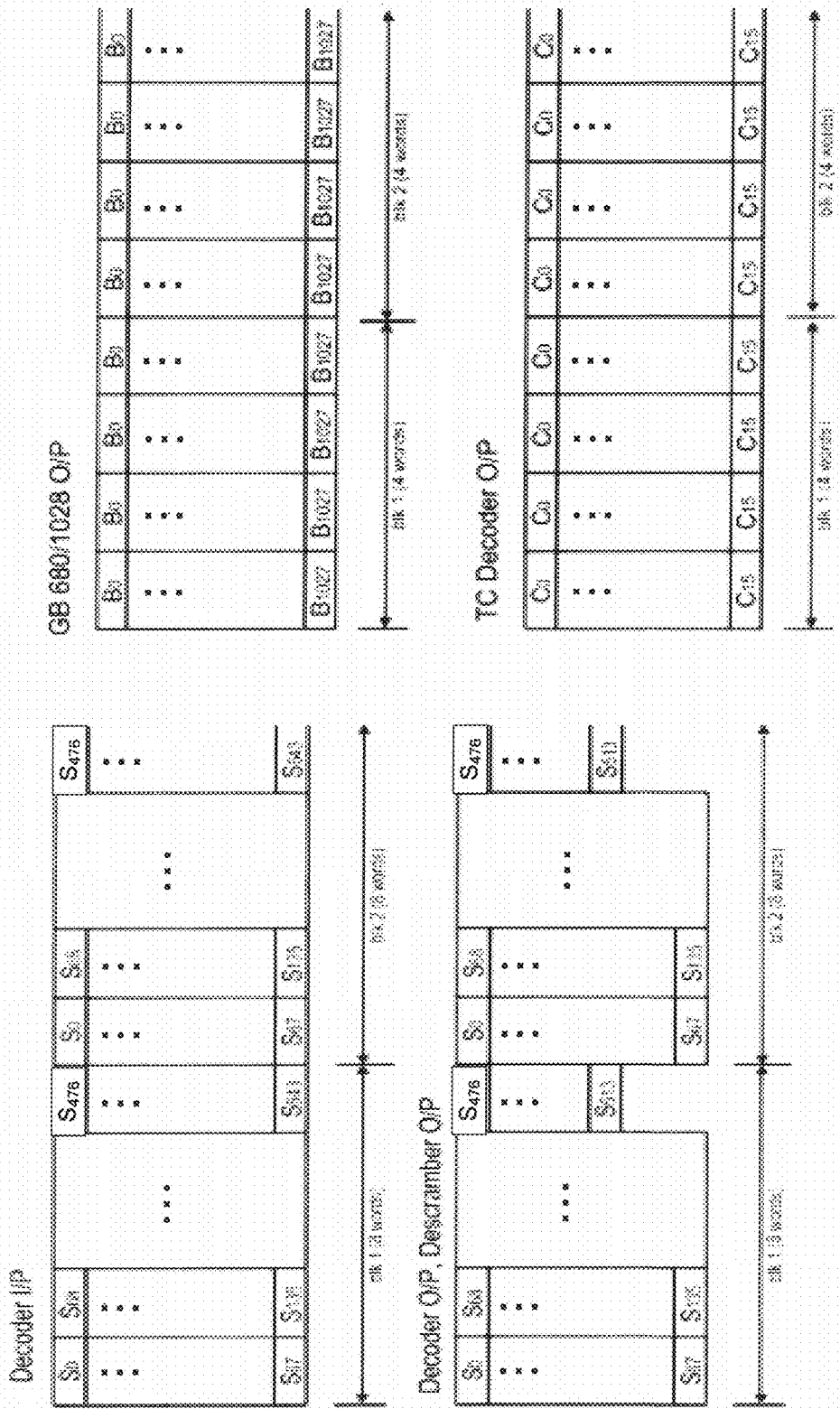
FIG. 2 depicts input and output data flows of an FEC decoder in accordance with the first embodiment of the invention.
FIG. 3 depicts outputs of a gearbox and a TC decoder in accordance with the first embodiment of the invention.

FIG. 2 depicts input and output data flows of an FEC decoder in accordance with the first embodiment of the invention. The FEC decoder corresponds to the RS decoder 160 in this embodiment. The RS decoder input flow (Decoder I/P) is shown at the top of FIG. 2, while the RS decoder output flow (Decoder O/P) is shown at the bottom. The descrambler output flow (Descrambler O/P) is similar to the RS decoder output flow.

In the example depicted, the decoder input flow is in blocks of 544 symbols. At 10 bits per symbols, each block in the input flow has 5440 bits. As further depicted, each block may be broken down into a maximum of eight 68 symbol (680 bit) words, where one word may be input into the RS decoder 160 in one clock cycle. The eight words of a block include, respectively, symbols $S_0$-$S_{67}$, $S_{68}$-$S_{135}$, and so on, with the last word including symbols $S_{476}$-$S_{543}$.

In the example depicted, the decoder (and descrambler) output flow is in blocks of 514 symbols. At 10 bits per symbols, each block in the output flow has 5140 bits. As further depicted, each block may be broken down into eight 68 symbol (680 bit) words, where one word may be output by the RS decoder 160 (and the descrambler 162) in one clock cycle. As shown, each word includes the maximum number of 68 symbols (680 bits) but may have less than the maximum number. In this case, the first seven words of a block have 68 symbols ($S_0$-$S_{67}$, $S_{68}$-$S_{135}$, and so on), and the eighth and last word of the block has 38 symbols ($S_{476}$-$S_{513}$) which is less than the maximum number.

FIG. 3 depicts outputs of a gearbox and a TC decoder in accordance with the first embodiment of the invention. The gearbox output flow (Gearbox O/P) is shown at the top of FIG. 3, while the TC decoder output flow (TC Decoder O/P) is shown at the bottom. The gearbox corresponds to the gearbox 164 in this embodiment.

In the example depicted, the gearbox output flow is in blocks of four words, each word having 1028 bits ($B_0$-$B_{1027}$). Further in this example, the TC decoder output flow is in blocks of four 1056-bit words, each word having 16 PCS (physical coding sub-layer) code words, where each PCS code word is 66 bits.

Example Level 2 Embodiment

FIG. 4 depicts a transmitter and a receiver with high-speed forward error correction in accordance with a second embodiment of the present invention. The particular embodiment depicted in FIG. 4 satisfies the Level 2 conditions described above. In other words, the first and second conditions are satisfied, but the third condition is not satisfied.

Transmitter (Level 2 Example)

As depicted, the transmitter in FIG. 4 includes multiple virtual lane queues (VL0-VL19) 402, TC encoder 404, initial gearbox 406, scrambler 408, RS encoder 410, bit striping circuit 412, alignment insertion (insert alignment) circuits 414, elastic gearboxes (egb) 416, and PMA circuits 418. The transmitter components in FIG. 4 generally function in an analogous manner to the transmitter components in FIG. 1. However, there are some differences as described in the following.

In the embodiment shown in FIG. 4, the input and output buses from the input bus of the TC encoder 404 through the input buses of the elastic gearboxes 416 each operate at 629.0 MHz (versus 156.3 MHz in FIG. 1).

In addition, various bus widths are different in the embodiment shown in FIG. 4. The TC encoder 404 has an input bus width of 512 bits and an output bus width of 514 bits. The initial gearbox 406 changes the bus width from 514 bits to 170 bits such that the inputs and outputs of the scrambler 408 and RS encoder 410 are each 170 bits (versus 680 bits in FIG. 1).

Furthermore, elastic gearboxes 416 are used in FIG. 4. As described above, an elastic gearbox in a transmitter may be an elastic-input gearbox that switches its input between multiple bus widths to effectively achieve a fractional (i.e. a non-whole-number) bus width.

In the depicted example, there are four elastic gearboxes 416 for the 4-lane transmitter. A first pair (for instance, the top two) of the elastic gearbox (egb) circuits may receive 42 bits on even clock cycles and 43 bits on odd clock cycles, and a second pair (for instance, the bottom two) of the elastic gearbox circuits 416 may receive 42 bits on odd clock cycles and 43 bits on even clock cycles. Hence, a total of 170 bits is received at each clock cycle. As depicted, each of the four elastic gearbox circuits 416 may have an output of 128 bits at 211.3 MHz. Four lanes of 128 bits at a frequency of 211.3 MHz provide a data rate of approximately 100 Gbps.

More generally, a set of elastic gearbox circuits may include an even number N elastic gearbox circuits in parallel which may include two groups. A first group of N/2 gearbox circuits outputs a first number n bits on even clock cycles and a second number m bits on odd clock cycles. A second group of N/2 gearbox circuits outputs the second number m bits on the odd clock cycles and the first number n bits on the even clock cycles. As such, on average, the N gearbox circuits output (n+m)×N/2 bits per output cycle.

Receiver (Level 2 Example)

As depicted, the receiver in FIG. 4 includes multiple PMA circuits 452 (one for each physical serial lane), elastic gearboxes 454, block synchronization and deskewing (blksync+deskew) circuits 456, multiplexing and remapping (mux and remap) circuit 458, RS decoder 460, descrambler 462, last gearbox 464, TC decoder 466, and multiple virtual lane buffers (VL0-VL19) 468. The receiver components in FIG. 4 generally function in an analogous manner to the receiver components in FIG. 1. However, there are some differences as described in the following.

In the embodiment shown in FIG. 4, the input and output buses from the output buses of the elastic gearboxes 454 through the output bus of the TC decoder 466 each operate at 629.0 MHz (versus 156.3 MHz in FIG. 1).

Various bus widths are also different in the embodiment shown in FIG. 4. As described further below, the elastic gearboxes 454 each have an output bus width of 43 bits (which outputs either 42 or 43 bits). As a result, the RS decoder 460 has a bus width of 170 bits (four lanes×42.5 bits per lane). The last gearbox 464 changes the bus width from 170 bits to 514 bits. The TC decoder 466 has an input bus width of 514 bits and an output bus width of 512 bits.

In addition, elastic gearboxes 454 are used in FIG. 4. As depicted, each of the four elastic gearbox circuits 454 may have an input of 128 bits at 211.3 MHz. Four lanes of 128 bits at a frequency of 211.3 MHz provide a data rate of approximately 100 Gbps. As described above, an elastic gearbox in a receiver may be an elastic-output gearbox that switches its output between multiple bus widths to effectively achieve a fractional (i.e. a non-whole-number) bus width. In the depicted example, there are four elastic gearboxes 454 for the 4-lane receiver. A first pair (for instance, the top two) of the elastic gearbox (egb) circuits may output 42 bits on even clock cycles and 43 bits on odd clock cycles, and a second pair (for instance, the bottom two) of the elastic gearbox circuits 454 may output 42 bits on odd clock cycles and 43 bits on even clock cycles. Hence, a total of 170 bits may be output at each clock cycle.

Example Level 3 Embodiment

FIG. 5 depicts a transmitter and a receiver with high-speed forward error correction in accordance with a third embodiment of the present invention. The particular embodiment depicted in FIG. 5 satisfies the Level 3 conditions described above. In other words, the first and third conditions are satisfied, but the second condition is not satisfied.

Transmitter (Level 3 Example)

As depicted, the transmitter in FIG. 5 includes multiple virtual lane queues (VL0-VL19) 502, TC encoder 504, initial gearbox 506, scrambler 508, RS encoder 510, bit striping circuit 512, alignment insertion (insert alignment) circuits 514, variable gearboxes (vgb) 516, and PMA circuits 518. The transmitter components in FIG. 5 generally function in an analogous manner to the transmitter components in FIG. 1. However, there are some differences as described in the following.

In the embodiment shown in FIG. 5, the input and output buses of the TC encoder 504 operate at 228.0 MHz (versus 156.3 MHz in FIG. 1). In addition, the input and output buses from the output bus of initial gearbox 506 through the input buses of the elastic gearboxes 516 each operate at 266.4 MHz (versus 156.3 MHz in FIG. 1).

In addition, various bus widths are different in the embodiment shown in FIG. 5. The TC encoder 504 has an input bus width of 512 bits and an output bus width of 514 bits. The initial gearbox 506 changes the bus width from 514 bits to 440 bits such that the inputs and outputs of the scrambler 508 and RS encoder 510 are each 440 bits wide (versus 680 bits wide in FIG. 1). As described further below, the variable gearboxes 516 have input bus widths of 110 bits.

Furthermore, variable gearboxes 516 are used in FIG. 5. As described above, a variable gearbox in a transmitter may be a variable-input gearbox that receives different numbers of symbols for different clock cycles. For example, in a block of 13 cycles, the variable-input gearbox may receive 11 symbols (i.e. have a bus width of 11 symbols or 110 bits at 10 bits per symbol) for the first through twelfth cycles and may receive 4 symbols (i.e. have a bus width of 4 symbols or 40 bits at 10 bits per symbol) for the thirteenth cycle. In this example, over the thirteen cycles, $12 \times 11 + 1 \times 4 = 136$ symbols would be received by the variable-input gearbox. If there are four variable-input gearboxes for a 4-lane transmitter, then the four variable-input gearboxes would receive $136 \times 4 = 544$ symbols over the thirteen cycles. As depicted, each of the four variable-input gearbox circuits may have an output of 128 bits at 211.3 MHz. Four lanes of 128 bits at a frequency of 211.3 MHz provide a data rate of approximately 100 Gbps.

Receiver (Level 3 Example)

As depicted, the receiver in FIG. 5 includes multiple PMA circuits 552 (one for each physical serial lane), variable gearboxes 554, block synchronization and deskewing (blksync+deskew) circuits 556, multiplexing and remapping (mux and remap) circuit 558, RS decoder 560, descrambler 562, last gearbox 564, TC decoder 566, and multiple virtual lane buffers (VL0-VL19) 568. The receiver components in FIG. 5 generally function in an analogous manner to the receiver components in FIG. 1. However, there are some differences as described in the following.

In the embodiment shown in FIG. 5, the input and output buses from the output buses of the variable gearboxes 554 through the input bus of the last gearbox 564 each operate at 266.4 MHz (versus 156.3 MHz in FIG. 1). In addition, the input and output buses of the TC decoder 566 operate at 228.0 MHz (versus 156.3 MHz in FIG. 1).

Various bus widths are also different in the embodiment shown in FIG. 5. As described further below, the variable gearboxes 554 each have an output bus width of 110 bits (which may output a variable number of bits). As a result, the RS decoder 560 has a bus width of 440 bits (four lanes×110 bits per lane). The last gearbox 564 changes the bus width from 440 bits to 514 bits. The TC decoder 566 has an input bus width of 514 bits and an output bus width of 512 bits.

In addition, variable gearbox circuits 554 are used in FIG. 5. As depicted, each of the four variable gearbox circuits 554 may have an input of 128 bits at 211.3 MHz. Four lanes of 128 bits at a frequency of 211.3 MHz provide a data rate of approximately 100 Gbps. As described above, a variable gearbox in a receiver may be a variable-output gearbox that outputs different numbers of symbols for different clock cycles. For example, in a block of 13 cycles, a variable-output gearbox may output 11 symbols (i.e. have an output bus width of 11 symbols or 110 bits at 10 bits per symbol) for the first through twelfth cycles and may output 4 symbols (i.e. have an output bus width of 4 symbols or 40 bits at 10 bits per symbol) for the thirteenth cycle. In this example, over the thirteen cycles, $12 \times 11 + 1 \times 4 = 136$ symbols would be output by the variable-output gearbox. If there are four variable-output gearboxes for a 4-lane receiver, then the four variable-output gearboxes would output $136 \times 4 = 544$ symbols over the thirteen cycles.

Figure 6:
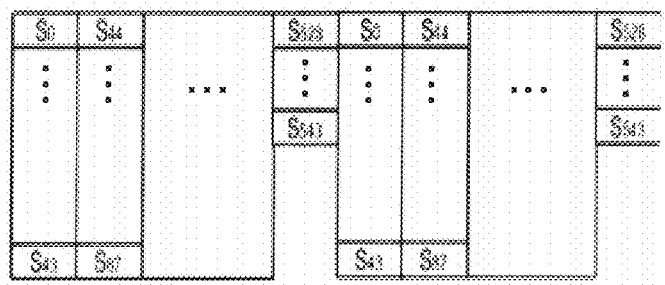
FIG. 6 depicts input and output data flows of an FEC decoder in accordance with the third embodiment of the invention.
Figure 6:
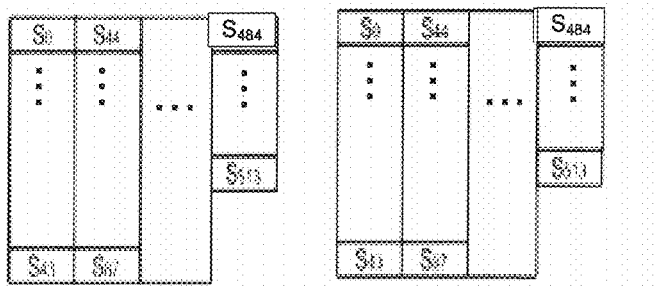

FIG. 6 depicts input and output data flows of an FEC decoder in accordance with the third embodiment of the invention. The FEC decoder corresponds to the RS decoder 560 in this embodiment. The RS decoder input flow (Decoder I/P) is shown at the top of FIG. 6, while the RS decoder output flow (Decoder O/P) is shown at the bottom.

In the example depicted, the decoder input flow is in blocks of 544 symbols. At 10 bits per symbols, each block in the input flow has 5440 bits. As further depicted, each block may be input in a thirteen cycle period where one word may be input into the RS decoder 560 in one clock cycle. The first twelve cycles may receive a 44-symbol (440-bit) word and one last (thirteenth) cycle may receive a 16-symbol (160-bit) word. Hence, the thirteen words of a block include, respectively, 44-symbol words ($S_0$-$S_{43}$, $S_{44}$-$S_{87}$, and so on) for the first twelve words and a 16-symbol word ($S_{528}$-$S_{543}$) for the thirteenth word.

In the example depicted, the decoder output flow is in blocks of 514 symbols. At 10 bits per symbols, each block in the output flow has 5140 bits. As further depicted, each block may be output in a thirteen cycle period where one word may be output from the RS decoder 560 in one clock cycle. The first eleven cycles may output a 44-symbol (440-bit) word, the twelve cycle may output a 30-symbol (300-bit) word, and the last (thirteenth) cycle may output a 0-symbol word (i.e. may output no data). Hence, the thirteen words of a block include, respectively, 44-symbol words ($S_0$-$S_{43}$, $S_{44}$-$S_{87}$, and so on) for the first eleven words, 30-symbol word ($S_{484}$-$S_{513}$) for the twelfth word, and no data for the thirteenth word.

FIG. 7 provides a table showing various features of select embodiments of the invention. In this table, each embodiment achieves a data rate of 106.25 GHz (106,250.0 MHz). Each column in FIG. 7 corresponds to a specific embodiment. The table in FIG. 7 includes three Level 1 embodiments, one Level 2 embodiment, and five Level 3 embodiments. The structure for Level 1, 2 and 3 embodiments are described above in relation to FIGS. 1, 4 and 5, respectively.

In each of these embodiments, the PMA circuits (one per physical serial lane) have bus widths of 128 bits and data rates of 207.5 MHz. Also, in each of these embodiments, the TC encoders have an input bus width of 512 bits, an output bus width of 514 bits, and operate at 206.7 MHz. The TC decoders correspondingly have an input bus width of 514 bits, an output bus width of 512 bits, and operate at 206.7 MHz.

The first Level 1 embodiment listed has a bus width of 16 symbols (160 bits) and a clock rate of 664.1 MHz for both the RS encoder and the RS decoder. Each transmitter gearbox (one per lane) has an input bus width of 40 bits and an output bus width of 128 bits. Each receiver gearbox (one per lane) correspondingly has an input bus width of 128 bits and an output bus width of 40 bits.

The second Level 1 embodiment listed has a bus width of 32 symbols (320 bits) and a clock rate of 332.0 MHz for both the RS encoder and the RS decoder. Each transmitter gearbox (one per lane) has an input bus width of 80 bits and an output bus width of 128 bits. Each receiver gearbox (one per lane) correspondingly has an input bus width of 128 bits and an output bus width of 80 bits.

The third Level 1 embodiment listed has a bus width of 68 symbols (680 bits) and a clock rate of 156.3 MHz for both the RS encoder and the RS decoder. Each transmitter gearbox (one per lane) has an input bus width of 170 bits and an output bus width of 128 bits. Each receiver gearbox (one per lane) correspondingly has an input bus width of 128 bits and an output bus width of 170 bits.

The Level 2 embodiment listed has a bus width of 17 symbols (170 bits) and a clock rate of 625.0 MHz for both the RS encoder and the RS decoder. The transmitter elastic gearboxes (one per lane) have an input bus width of 43 bits (that is used to receive an average of 42.5 bits per cycle) and an output bus width of 128 bits. The receiver elastic gearboxes (one per lane) correspondingly have an input bus width of 128 bits and an output bus width of 43 bits (that is used to transmit an average of 42.5 bits per cycle).

The first Level 3 embodiment listed has a bus width of 18 symbols (180 bits) and a clock rate of 590.3 MHz for both the RS encoder and the RS decoder. Each transmitter variable gearbox (one per lane) has an input bus width of 45 bits (that is used to input a variable number of bits, such as 45 or 10 bits) and an output bus width of 128 bits. Each receiver variable gearbox (one per lane) correspondingly has an input bus width of 128 bits and an output bus width of 45 bits (that is used to output a variable number of bits, such as 45 or 10 bits).

The second Level 3 embodiment listed has a bus width of 20 symbols (200 bits) and a clock rate of 531.3 MHz for both the RS encoder and the RS decoder. Each transmitter variable gearbox (one per lane) has an input bus width of 50 bits (that is used to input a variable number of bits, such as 50 or 10 bits) and an output bus width of 128 bits. Each receiver variable gearbox (one per lane) correspondingly has an input bus width of 128 bits and an output bus width of 50 bits (that is used to output a variable number of bits, such as 50 or 10 bits).

The third Level 3 embodiment listed has a bus width of 30 symbols (300 bits) and a clock rate of 354.2 MHz for both the RS encoder and the RS decoder. Each transmitter variable gearbox (one per lane) has an input bus width of 75 bits (that is used to input a variable number of bits, such as 75 or 10 bits) and an output bus width of 128 bits. Each receiver variable gearbox (one per lane) correspondingly has an input bus width of 128 bits and an output bus width of 75 bits (that is used to output a variable number of bits, such as 75 or 10 bits).

The fourth Level 3 embodiment listed has a bus width of 36 symbols (360 bits) and a clock rate of 295.1 MHz for both the RS encoder and the RS decoder. Each transmitter variable gearbox (one per lane) has an input bus width of 90 bits (that is used to input a variable number of bits, such as 90 or 10 bits) and an output bus width of 128 bits. Each receiver variable gearbox (one per lane) correspondingly has an input bus width of 128 bits and an output bus width of 90 bits (that is used to output a variable number of bis, such as 90 or 10 bits).

The fifth Level 3 embodiment listed has a bus width of 44 symbols (440 bits) and a clock rate of 241.5 MHz for both the RS encoder and the RS decoder. Each transmitter variable gearbox (one per lane) has an input bus width of 110 bits (that is used to input a variable number of bits, such as 110 or 40 bits) and an output bus width of 128 bits. Each receiver variable gearbox (one per lane) correspondingly has an input bus width of 128 bits and an output bus width of 110 bits (that is used to output a variable number of bits, such as 90 or 10 bits).

FPGA Implementation

Figure 8:
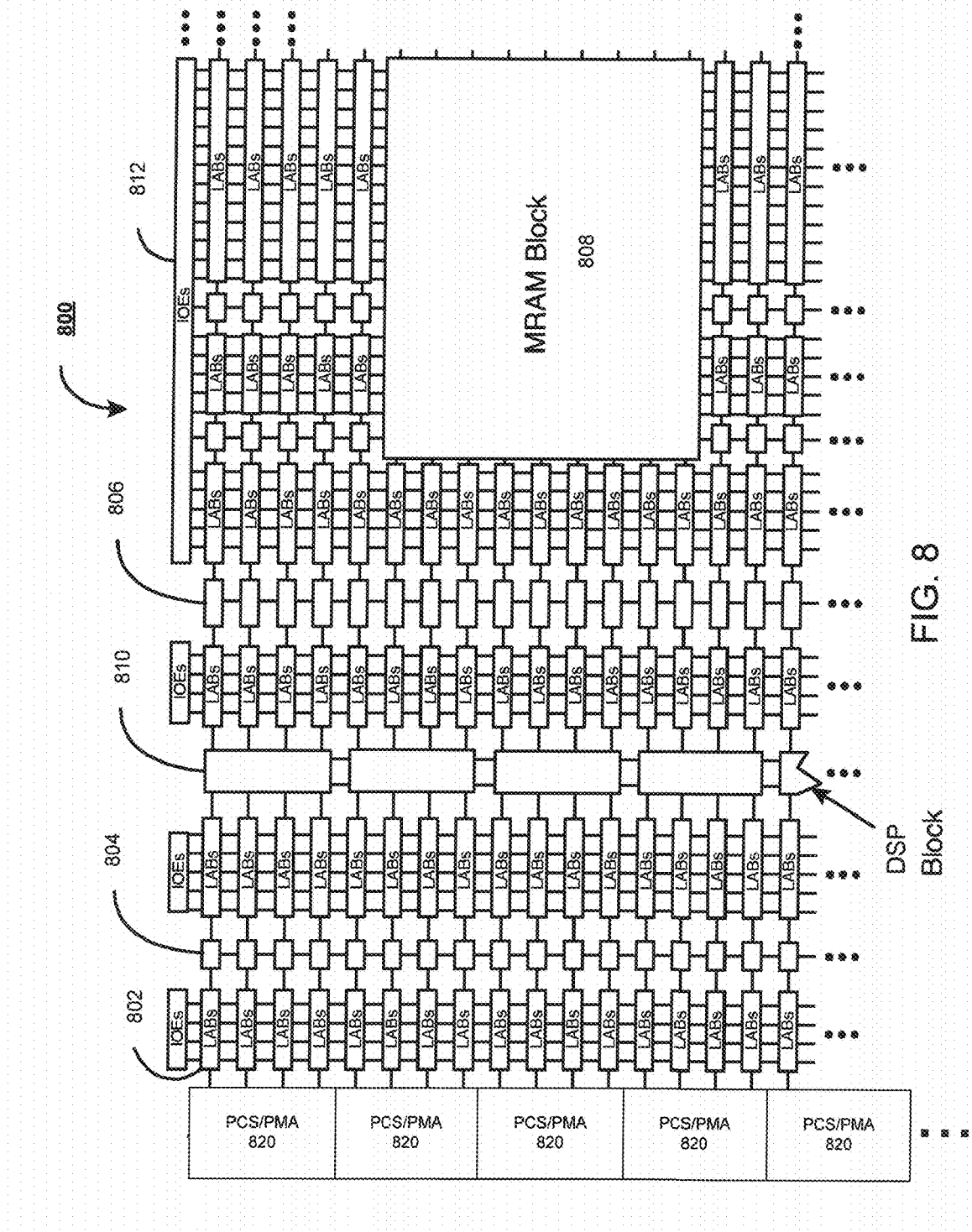
FIG. 8 is a simplified partial block diagram of a field programmable gate array (FPGA) that may be configured to implement an embodiment of the present invention.

FIG. 8 is a simplified partial block diagram of a field programmable gate array (FPGA) 800 that may be configured with circuitry to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 800 includes within its "core" a two-dimensional array of programmable logic array blocks (or LABs) 802 that are interconnected by a network of column and row interconnect conductors of varying length and speed. LABs 802 include multiple logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 may also include a distributed memory structure including random access memory (RAM) blocks of varying sizes provided throughout the array. The RAM blocks include, for example, blocks 804, blocks 806, and block 808. These memory blocks can also include shift registers and FIFO buffers.

FPGA 800 may further include digital signal processing (DSP) blocks 810 that can implement, for example, multipliers with add or subtract features. Input/output elements (IOEs) 812 located, in this example, around the periphery of the chip support numerous single-ended and differential input/output standards. Each IOE 812 is coupled to an external terminal (i.e., a pin) of FPGA 800.

An array of PMA and PCS circuitry 820 may be included as shown, for example. The PCS circuitry generally provides digital logic functions which implement data communication protocols, while the PMA circuitry generally provides mixed (analog/digital) signal functionality for the data communications. For example, for certain protocols, the PCS circuitry may be configured to perform, among other functions, 8 bit-to-10 bit and/or 128 bit-to-130 bit encoding for data to be sent to the PMA circuitry and 10 bit-to-8 bit and/or 130 bit-to-128 bit decoding for data received from the PMA circuitry. The PMA circuitry may be configured to perform, among other functions, serialization of data to be transmitted (conversion from parallel to serial) and de-serialization of received data (conversion from serial to parallel).

A subset of the LABs 802 coupled to modules in the PMA/PCS array 820 may be configured to implement the methods and apparatus described above. Alternatively, the above-described methods and apparatus may be implemented using hardwired circuitry, or part configured LABs 802 and part hardwired circuitry.

It is to be understood that FPGA 800 is described herein for illustrative purposes only and that the present invention can be implemented in many different types of PLDs, FPGAs, and ASICs.

Figure 9:
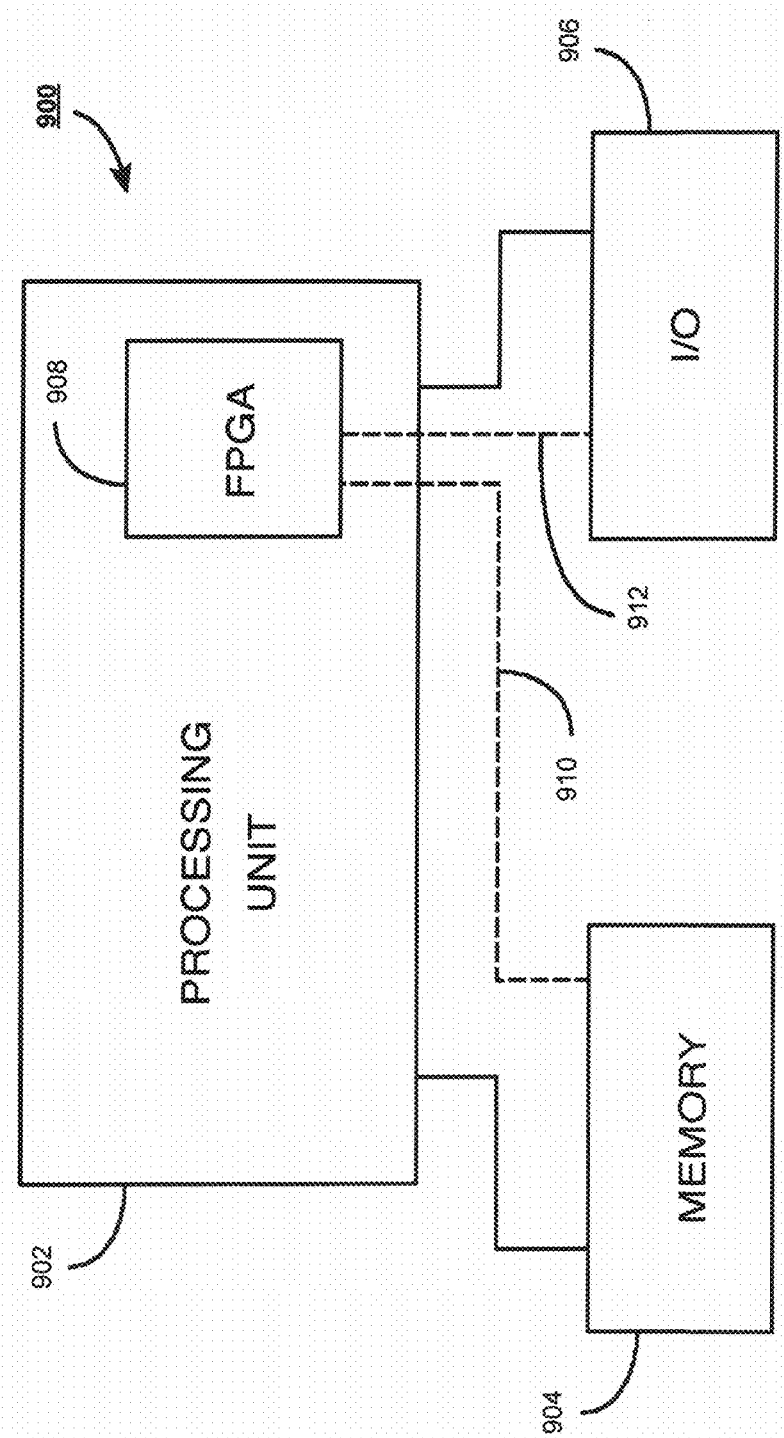
FIG. 9 shows a block diagram of an exemplary digital system that may be configured to utilize an embodiment of the present invention.

The present invention can also be implemented in a system that has a FPGA as one of several components. FIG. 9 shows a block diagram of an exemplary digital system 900 that can embody techniques of the present invention. System 900 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 may be provided on a single board, on multiple boards, or within multiple enclosures.

System 900 includes a processing unit 902, a memory unit 904, and an input/output (I/O) unit 906 interconnected together by one or more buses. According to this exemplary embodiment, FPGA 908 is embedded in processing unit 902. FPGA 908 can serve many different purposes within the system 900. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 may direct data to an appropriate system component for processing or storage, execute a program stored in memory 904, receive and transmit data via I/O unit 906, or other similar function. Processing unit 902 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 may control the logical operations of the system. As another example, FPGA 908 acts as a reconfigurable processor that may be reprogrammed as needed to handle a particular computing task. Alternately, FPGA 908 may itself include an embedded microprocessor. Memory unit 904 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A transmitter for a multi-lane data link, the transmitter comprising:
   a plurality of physical media attachment circuits for serializing data for a plurality of serial lanes of the multi-lane data link, each physical media attachment circuit receiving the data at a first bus width;
   a plurality of gearbox circuits, each gearbox circuit outputting the data at the first bus width and receiving the data at a second bus width, wherein the first bus width is different from the second bus width; and
   a forward error correction (FEC) encoder for encoding and outputting the data at a third bus width, wherein the third bus width in bits is a product of the second bus width in bits and a number of the serial lanes of the multi-lane data link, and wherein the data is encoded with an FEC code having a block length,
   wherein the third bus width in bits is not an exact multiplier of a number of serial lanes of the multi-lane interface;
   wherein the plurality of gearbox circuits comprises an even number N gearbox circuits in parallel, a first group of N/2 gearbox circuits receives a first number n bits on even clock cycles and a second number bits on odd clock cycles, and a second group of N/2 gearbox circuits receives the second number in bits on the odd clock cycles and the first number n bits on the even clock cycles, such that on average the N gearbox circuits receives (n+m)×N/2 bits per input cycle;
   wherein the third bus width in bits is an exact multiple of a number of bits per symbol in the data; and
   wherein the block length in bits is an exact multiple of the third bus width.

2. The transmitter of claim 1, wherein the number of bits per symbol is ten, the number of serial lanes of the multi-lane data link is four, the first bus width is 128 bits, the second bus width switches of 43 bits, and the third bus width is 170 bits, and the block length is 5440 bits.

3. The transmitter of claim 1, wherein the third bus width in bits is an exact multiple of a number of serial lanes of the multi-lane interface.

4. The transmitter of claim 3, wherein the number of bits per symbol is ten, the number of serial lanes of the multi-lane data link is four, the first bus width is 128 bits, the second bus width is 40 bits, and the third bus width is 160 bits, and the block length is 5440 bits.

5. The transmitter of claim 3, wherein the number of bits per symbol is ten, the number of serial lanes of the multi-lane data link is four, the first bus width is 128 bits, the second bus width is 80 bits, and the third bus width is 320 bits, and the block length is 5440 bits.

6. The transmitter of claim 3, wherein the number of bits per symbol is ten, the number of serial lanes of the multi-lane data link is four, the first bus width is 128 bits, the second bus width is 170 bits, and the third bus width is 680 bits, and the block length is 5440 bits.

7. A transmitter for a multi-lane data link, the transmitter comprising:
- a plurality of physical media attachment circuits for serializing data for a plurality of serial lanes of the multi-lane data link, each physical media attachment circuit receiving the data at a first bus width;
- a plurality of gearbox circuits, each gearbox circuit outputting the data at the first bus width and receiving the data at a second bus width, wherein the first bus width is different from the second bus width; and
- a forward error correction (FEC) encoder for encoding and outputting the data at a third bus width, wherein the third bus width in bits is a product of the second bus width in bits and a number of the serial lanes of the multi-lane data link, and wherein the data is encoded with an FEC code having a block length,
- wherein the third bus width in bits is an exact multiple of a number of bits per symbol in the data, and
- wherein the third bus width in bits is an exact multiple of a number of serial lanes of the multi-lane interface.

8. The transmitter of claim 7, wherein the block length in bits is not an exact multiple of the third bus width.

9. The transmitter of claim 8, wherein the plurality of gearbox circuits comprises variable gearbox circuits that receives a variable number of symbols per clock cycle.

10. The transmitter of claim 8, wherein the number of bits per symbol is ten, the number of serial lanes of the multi-lane data link is four, the first bus width is 128 bits, the second bus width is 45 bits, and the third bus width is 180 bits, and the block length is 5440 bits.

11. The transmitter of claim 8, wherein the number of bits per symbol is ten, the number of serial lanes of the multi-lane data link is four, the first bus width is 128 bits, the second bus width is 50 bits, and the third bus width is 200 bits, and the block length is 5440 bits.

12. The transmitter of claim 8, wherein the number of bits per symbol is ten, the number of serial lanes of the multi-lane data link is four, the first bus width is 128 bits, the second bus width is 75 bits, and the third bus width is 300 bits, and the block length is 5440 bits.

13. The transmitter of claim 8, wherein the number of bits per symbol is ten, the number of serial lanes of the multi-lane data link is four, the first bus width is 128 bits, the second bus width is 90 bits, and the third bus width is 360 bits, and the block length is 5440 bits.

14. The transmitter of claim 8, wherein the number of bits per symbol is ten, the number of serial lanes of the multi-lane data link is four, the first bus width is 128 bits, the second bus width is 110 bits, and the third bus width is 440 bits, and the block length is 5440 bits.

15. A forward error correction (FEC) circuit for a multi-lane interface, the FEC circuit comprising:
- an output bus having a bus width;
- an FEC encoder for, encoding data received on the output bus, wherein the data is encoded with an FEC code having a block length; and
- an input bus for receiving the encoded data from the FEC encoder,
- wherein the bus width in bits is an exact multiple of a number of bits per symbol in the data, and
- wherein the block length in bits is an exact multiple of the bus width.

16. The FEC circuit of claim 15, wherein the FEC code comprises a Reed Solomon code.

17. A forward error correction (FEC) circuit for a multi-lane interface, the FEC circuit comprising:
- an output bus having a bus width;
- an FEC encoder for encoding data for output on the output bus, wherein the data is encoded with an FEC code having a block length; and
- an input bus for receiving the data for the FEC encoder,
- wherein the bus width in bits is an exact multiple of a number of bits per symbol in the data, and
- wherein the bus width in bits is an exact multiple of a number of serial lanes of the multi-lane interface.

* * * * *